US007687334B2

(12) United States Patent
Zou et al.

(10) Patent No.: US 7,687,334 B2
(45) Date of Patent: Mar. 30, 2010

(54) FABRICATION OF LARGE GRAIN POLYCRYSTALLINE SILICON FILM BY NANO ALUMINUM-INDUCED CRYSTALLIZATION OF AMORPHOUS SILICON

(75) Inventors: Min Zou, Fayetteville, AR (US); Li Cai, Fayetteville, AR (US); William David Brown, Fayetteville, AR (US)

(73) Assignee: Board of Trustees of the University of Arkansas, Little Rock, AR (US)

(\*) Notice: Subject to any disclaimer, the term of this patent is extended or adjusted under 35 U.S.C. 154(b) by 0 days.

(21) Appl. No.: 11/728,264

(22) Filed: Mar. 23, 2007

(65) Prior Publication Data

US 2007/0224788 A1    Sep. 27, 2007

Related U.S. Application Data

(60) Provisional application No. 60/785,841, filed on Mar. 23, 2006.

(51) Int. Cl.
    *H01L 21/00* (2006.01)
(52) U.S. Cl. .............................. 438/166; 257/E21.133; 257/E21.134
(58) Field of Classification Search ........................ None
    See application file for complete search history.

(56) References Cited

U.S. PATENT DOCUMENTS

| 5,940,693 | A\*  | 8/1999  | Maekawa ............... 438/166 |
| 6,297,080 | B1\* | 10/2001 | Lee et al. ............... 438/151 |
| 6,727,121 | B2\* | 4/2004  | Joo et al. ............... 438/149 |
| 2002/0132452 | A1\* | 9/2002  | Oka et al. ............... 438/478 |
| 2004/0106227 | A1\* | 6/2004  | Naseem et al. ............ 438/78 |
| 2004/0266080 | A1\* | 12/2004 | Jyumonji et al. .......... 438/166 |

OTHER PUBLICATIONS

Quick et al. "Photoresist Dispensing Methods", Semiconductor Manufacturing Technology, Prentice Hall, New Jersey, 201, pp. 357.\*
Stephan et al. "Polymer etching and deposition of amorphous silicon using a VHF coaxial helix plasma source", Surface and Coatings Technology (1999) 384-388.\*
Qi et al. "Experimental study of aluminum-induced crystallization of amorphous silicon thin films," Surface & Coating Technolgy, 198, 2005, pp. 300-303.\*
Stephan et al. ("Polymer etching and deposition of amorphous silicon using a VHF coaxial helix plasma source", Surface and Coatings Technology (1999) 384-388).\*

(Continued)

*Primary Examiner*—W. David Coleman
*Assistant Examiner*—Shaka Scarlett
(74) *Attorney, Agent, or Firm*—Morris, Manning & Martin LLP; Tim Tingkang Xia

(57) ABSTRACT

One aspect of the present invention relates to a method for fabricating a polycrystalline silicon film. In one embodiment, the method includes the steps of providing a substrate having a thermally-grown silicon dioxide layer, forming an amorphous silicon film on the thermally-grown silicon dioxide layer of the substrate, forming an aluminum layer on the amorphous silicon film to form a structure having the substrate, the amorphous silicon film and the aluminum layer, and annealing the structure at an annealing temperature for a period of time in an $N_2$ environment with a ramp-up time to crystallize the amorphous silicon film to form a polycrystalline silicon film.

26 Claims, 13 Drawing Sheets

OTHER PUBLICATIONS

Quick et al. "Photoresist Dispensing Methods", Semiconductor Manufacturing Technology, Prentice Hall, New Jersey, 201, pp. 357.*

Tim Searle, Thermal expansion coefficient of a-Si and a-Si:H, Properties of Amorphous Silicon and its Alloys, 1998, p. 370, INSPEC, The Institution of Electrical Engineers, London, United Kingdom.

Li Cai et al., Understanding the Effects of Stress on the Crystallization of Amorphous Silicon, Journal of Electronic Materials, 2007, pp. 191-196, vol. 36, No. 3.

Shu Hamada et al., Impact of Grain Boundary Character on Electrical Property in Polycrystalline Silicon, Mat. Res. Soc. Symp. Proc., 2000, pp. 163-168, vol. 586, Materials Research Society.

Ram Kishore et al., Aluminum-Induced Crystallization of Amorphous Silicon ($\alpha$-Si:H) at 150° C., Electrochemical and Solid-State Letters, 2001, pp. G14-G16, vol. 4, The Electrochemical Society, Inc.

Byung-Il Lee et al., A study on the Metal Induced Lateral Crystallization Behavior of Amorphous Silicon Thin Films, Mat. Res. Soc. Symp. Proc., 1997, pp. 101-106, vol. 441, Materials Research Society.

Jae Hwan Oh et al., Anomalous Increase of Grain Size in Ni-Mediated Crystallization of Amorphous Silicon, Electrochemical and Solid-State Letters, 2004, pp. H52-H54, vol. 7, The Electrochemical Society.

Victor W. C. Chan et al., The Effects of Grain Boundaries in the Electrical Characteristics of Large Grain Polycrystalline Thin-Film Transistors, IEEE Transactions on Electron Device, 2002, pp. 1384-1391, vol. 49, No. 8.

Ching-Ming Hsu et al., Stress Effect on Aluminum-Induced Crystallization of Sputtered Amorphous Silicon Thin Films, Jpn. J. Appl. Phys., Aug. 2003, pp. 4928-4934, vol. 42, Part 1, No. 8.

J. Klein et al., Aluminium-Induced Crystallisation of Amorphous Silicon: The Influence of the Aluminium Layer on the Process, 19th European Photovoltaic Solar Energy Conference, Jun. 7-11, 2004, pp. 1135-1138, Paris, France.

Oliver Nast et al., Aluminium-induced crystallisation of silicon on glass for thin-film solar cells, Solar Energy Materials & Solar Cells, 2001, pp. 385-392, vol. 65, Elsevier Science B. V.

E. Pihan et al., Polycrystalline silicon films by aluminium-induced crystallisation: growth process vs. silicon deposition method, Thin Solid Films, 2004, pp. 328-333, vol. 451-452, Elsevier B.V.

S. Gall et al., Aluminum-induced crystallization of amorphous silicon, Journal of non-Crystalline Solids, 2002, pp. 741-745, vol. 299-302, Elsevier Science B. V.

Ching-Ming Hsu et al., Stress Effect on Aluminum-Induced Crystallization of Sputtered Amorphous Silicon Thin films, Jpn. J. Appl. Phys., 2003, pp. 4928-4934, vol. 42, Part 1, No. 8.

Toyohiko J. Konno et al., Crystallization of Silicon in aluminium/amorphous-silicon multilayers, Philosophical Magazine B, 1992, pp. 749-765, vol. 66, No. 6, Taylor & Francis Ltd.

Oliver Nast et al., Influence of interface and Al structure on layer exchange during aluminum-induced crystallization of amorphous silicon, Journal of Applied Physics, 2000, pp. 716-724, vol. 88, No. 2, American Institute of Physics.

* cited by examiner

FABRICATION OF LARGE GRAIN POLYCRYSTALLINE SILICON FILM BY NANO ALUMINUM-INDUCED CRYSTALLIZATION OF AMORPHOUS SILICON

CROSS-REFERENCE TO RELATED PATENT APPLICATION

This application claims the benefit, pursuant to 35 U.S.C. §119(e), of U.S. provisional patent application Ser. Nos. 60/785,841, filed Mar. 23, 2006, entitled "FABRICATION OF LARGE GRAIN POLYCRYSTALLINE SILICON FILM BY NANO ALUMINUM-INDUCED CRYSTALLIZATION OF AMORPHOUS SILICON," By Min Zou, Li Cai and William David Brown, which is incorporated herein by reference in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [7] represents the 7th reference cited in the reference list, namely, L. Cai, H. Abu-Safe, M. Zou, M. Barghouti, M. Hossain, H. Naseem, W. B. Brown, Proceedings of the Symposium on Solid State Physics, The Electrochemical Society, PV 2004-12, 307, (2004).

FIELD OF THE INVENTION

The present invention relates generally to the crystallization of amorphous silicon and in particular to the utilization of a nanometer thick aluminum induced crystallization (nano-AIC) process to convert an amorphous silicon (a-Si:H) film into a continuous and smooth polycrystalline silicon film with large grains at low temperatures.

BACKGROUND OF THE INVENTION

Polycrystalline silicon is a material including multiple small silicon crystals, and has long been used as the conducting gate material in metal-oxide-semiconductor field-effect transistor (MOSFET) and complementary metal-oxide semiconductor (CMOS) processing technologies. It is usually fabricated by low-pressure chemical-vapour deposition (LPCVD), plasma enhanced chemical vapor deposition (PECVD), or solid-phase crystallization (SPC) of amorphous silicon (a-Si:H). However, these processes require relatively high temperatures.

The aluminum-induced crystallization (AIC) of amorphous silicon (a-Si:H) has great potential for various applications, such as thin film transistors, sensors, solar cells, and display panels [1-3]. The presence of aluminum in contact with a-Si:H can significantly reduce the temperature at which a-Si:H can be crystallized [4-8], which may gain great relevance in photoelectronic and photovoltaic devices where low temperature processes are critical. The performance of devices fabricated using polycrystalline silicon strongly depends on grain sizes in the polycrystalline silicon because grain boundaries normally act as traps and recombination centers for carriers [9, 10]. Therefore, great attention has been drawn to increasing the average grain size of the polycrystalline silicon. For example, J. H. Oh obtained grain sizes of 104 µm after 580° C. annealing, using Ni mediated crystallization of amorphous silicon [13]. Although how to grow large size grains has been extensively investigated [11, 12], no one has reported a method of using the AIC technique to grow continuous and smooth highly doped polycrystalline silicon films with very large grains at low temperatures.

Therefore, a heretofore unaddressed need exists in the art to address the aforementioned deficiencies and inadequacies.

SUMMARY OF THE INVENTION

In one aspect, the present invention relates to a method for forming a polycrystalline silicon film. In one embodiment, the method includes the steps of providing a substrate having a thermally-grown silicon dioxide layer; forming an amorphous silicon film on the thermally-grown silicon dioxide layer of the substrate; forming an aluminum layer on the amorphous silicon film to form a structure having the substrate, the amorphous silicon film and the aluminum layer; and annealing the structure at an annealing temperature effective for a period of time in an $N_2$ environment with a ramp-up time to crystallize the amorphous silicon film to form a polycrystalline silicon film.

In one embodiment, the step of forming the amorphous silicon film is performed with a plasma-enhanced chemical vapor deposition (PECVD) process, where the PECVD system is configured such that the RF power, chamber pressure, substrate temperature, and $SiH_4$ flow rates are about 15 W, 0.5 Torr, 250° C., and 85 sccm, respectively. The step of forming the aluminum layer is performed by a metal evaporation process.

In one embodiment, the substrate comprises a silicon wafer. The thermally-grown silicon dioxide layer has a thickness, H1, in a range of about 1-3 µm, and is adapted for preventing the crystal orientation of the substrate from affecting the crystallization of the amorphous silicon film. The amorphous silicon film has a thickness, H2, in a range of about 50-200 nm. The aluminum layer has a thickness, H3, in a range of about 5-100 nm. The annealing temperature is in a range of about 50-450° C.

The aluminum layer can be formed uniformly such that the thickness H3 of the aluminum layer is substantially constant or is formed variable over the aluminum layer with a desired pattern. The polycrystalline silicon film has a plurality of crystallites, each crystallite having a crystallite size, where the crystallite size varies with the annealing temperature ramp-up time and/or the thickness H3 of the aluminum layer.

The method further includes the step of selectively etching off the aluminum layer from the annealed structure.

In another aspect, the present invention relates to a polycrystalline silicon film formed according to the method as disclosed above.

In yet another aspect, the present invention relates to a system for fabricating a polycrystalline silicon film. In one embodiment, the system has means for forming an amorphous silicon film on a substrate; means for forming an aluminum layer on the amorphous silicon film to form a structure having the substrate, the amorphous silicon film and the aluminum layer; and means for annealing the structure at an annealing temperature for a period of time in an $N_2$ environment with a ramp-up time to crystallize the amorphous silicon film into a polycrystalline silicon film, where the substrate comprises a silicon wafer having a thermally-grown silicon dioxide layer on which the amorphous silicon film is formed.

Furthermore, the system has means for selectively etching off the aluminum layer from the annealed structure.

In one embodiment, the means for forming the amorphous silicon film comprises a plasma-enhanced chemical vapor deposition (PECVD) system. The means for thermally forming the aluminum layer comprises a thermal evaporator.

In a further aspect, the present invention relates to a method for forming a desired pattern of polycrystalline silicon usable in a semiconductor device. In one embodiment, the method includes the steps of forming an amorphous silicon film on a substrate; forming an aluminum layer on the amorphous silicon film to form a structure having the substrate, the amorphous silicon film and the aluminum layer; patterning the aluminum layer of the structure to form a desired pattern thereon; annealing the patterned structure at an annealing temperature for a period of time in an $N_2$ environment with a ramp-up time to crystallize the amorphous silicon film to form a polycrystalline silicon film with the desired pattern; and electively etching off the aluminum layer from the annealed structure.

In one embodiment, the step of forming the amorphous silicon film is performed with a plasma-enhanced chemical vapor deposition (PECVD) process. The step of forming the aluminum layer is performed with a metal evaporation process. The step of patterning the aluminum layer comprises the steps of spin-coating a photoresist layer on the aluminum layer of the structure; forming a desired pattern in the spin-coated photoresist layer by a photolithographic process to uncover a portion of the aluminum layer according to the desired pattern; thinning the uncovered portion of the aluminum layer according to the desired pattern; and removing the remaining portion of the photoresist layer to uncover the remaining portion of the aluminum layer, where the step of thinning the uncovered portion of the aluminum layer is performed by a chemical process.

In one embodiment, the substrate has a silicon wafer having a thermally-grown silicon dioxide layer on which the amorphous silicon film is formed. The amorphous silicon film has a thickness, H2, in a range of about 50-200 nm. The aluminum layer is patterned such that its thickness, H3, in the desired pattern is substantially thinner than that in the remaining portion of the aluminum layer, and wherein the thickness H3 of the aluminum layer in the desired pattern is in a range of about 5-100 nm. In one embodiment, the annealing temperature is in a range of about 50-450° C.

In yet a further aspect, the present invention relates to a polycrystalline silicon film with a desired pattern formed according to the above method.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
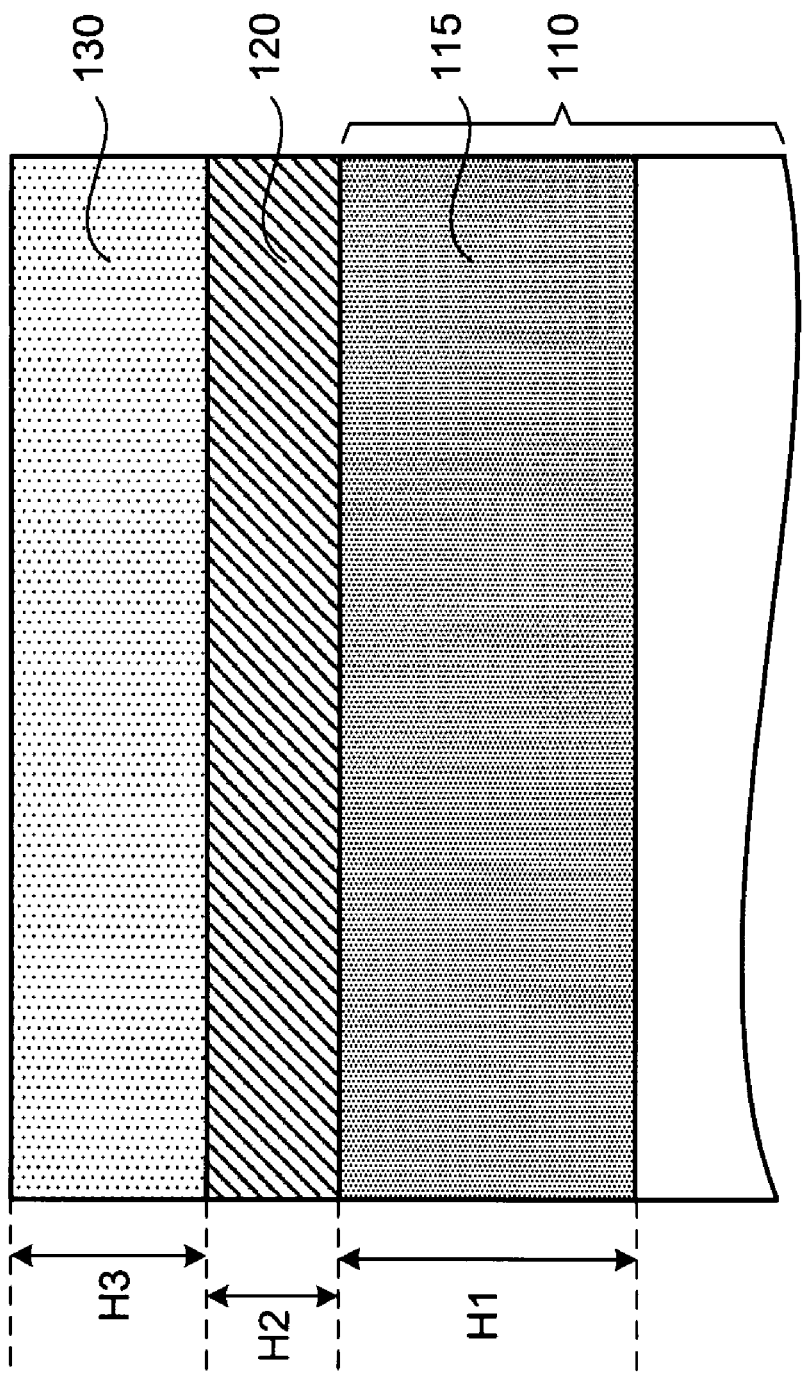
FIG. 1 shows schematically a cross-sectional view of a structure (sample) having a substrate with a thermally-grown silicon dioxide layer, an amorphous silicon film formed on the silicon dioxide layer and an aluminum layer formed on amorphous silicon film, used for a nanometer thick aluminum induced crystallization (nano-AIC) of a-Si:H according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings of FIGS. 1-13, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

DEFINITIONS

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "about" or "approximately" shall generally mean within 20 percent, preferably within 10 percent, and more preferably within 5 percent of a given value or range. Numerical quantities given herein are approximate, meaning that the term "about" or "approximately" can be inferred if not expressly stated.

As used herein, the term "amorphous silicon" or "a-Si" refers to the non-crystalline allotropic form of silicon.

As used herein, the term "polycrystalline silicon" or "poly-silicon" refers to a material having multiple small silicon crystals or crystallites.

As used herein, the term "crystallization" refers to a process of formation of polycrystalline silicon from amorphous silicon. The crystallization process includes two major events, nucleation and crystal growth.

The nucleation is the onset of a phase transition in a small region of the amorphous silicon where molecules start to gather into clusters on the nanometer scale, which become stable under the current operating conditions. These stable clusters constitute the nuclei. The creation of a nucleus implies the formation of an interface at the boundaries of the new phase. The clusters need to reach a critical size in order to become stable nuclei. Such critical size is dictated by the operating conditions (temperature, super-saturation, irregularities, etc.). The crystal growth is the subsequent growth of the nuclei that succeed in achieving the critical cluster size.

OVERVIEW OF THE INVENTION

Polycrystalline silicon is a key component in MOSFET and CMOS processing technologies. The performance of devices utilizing polycrystalline silicon depends substantially on crystallite (grain) sizes of the polycrystalline silicon. The larger the crystallite sizes are, the better performance the devices have. Therefore, great attention has been drawn to increasing the average crystallite sizes of the polycrystalline silicon.

The present invention, among other things, discloses method and systems for fabrication of continuous and smooth polycrystalline silicon films with very large crystallites by a nano-AIC of plasma-enhanced chemical vapor deposited a-Si:H.

The description will be made as to the embodiments of the present invention in conjunction with the accompanying drawings of FIGS. 1-13. In accordance with the purposes of this invention, as embodied and broadly described herein, this invention, in one aspect, relates to a method for forming a polycrystalline silicon film usable in a semiconductor device.

According to the present invention, in one embodiment, the method includes the following steps: at first, a substrate is provided. In one embodiment, the substrate 110 is a silicon wafer having a thermally-grown silicon dioxide layer 115, as shown in FIG. 1. The thermally-grown silicon dioxide layer 115 has a thickness, H1, in a range of about 1-3 μm. The thermally-grown silicon dioxide layer 115 is adapted for preventing the crystal orientation of the substrate 110 from affecting the crystallization of amorphous silicon.

Secondly, an amorphous silicon film 120 is formed on the thermally-grown silicon dioxide layer 115 of the substrate. The amorphous silicon film 120 has a thickness, H2, in a range of about 50-200 nm. The amorphous silicon film 120, in one embodiment, is deposited on the thermally-grown silicon dioxide layer 115 with a PECVD process. In one embodiment, the PECVD system is configured such that the RF power, chamber pressure, substrate temperature, and $SiH_4$ flow rates are about 15 W, 0.5 Torr, 250° C., and 85 sccm, respectively.

Thirdly, an aluminum layer 130 is formed on the amorphous silicon film 120 to form a structure 100 having the substrate 110, the amorphous silicon film 120 and the aluminum layer 130, as shown in FIG. 1. The aluminum layer 120 is formed uniformly to have a uniform thickness, H3, in a range of about 5-100 nm. In one embodiment, the amorphous silicon film 120 is thermally deposited by a metal evaporation process in an evaporator.

Next, the structure 100 is annealed at an annealing temperature for a period of time in an $N_2$ environment with a ramp-up time to crystallize the amorphous silicon film into a polycrystalline silicon film. According to the present invention, the annealing temperature is in a range of about 50-450°

C. The annealing ramp-up time can vary from zero to 50 hours. The polycrystalline silicon film has a plurality of crystallites, and each crystallite can be characterized with a crystallite (grain) size that varies with the annealing temperature ramp-up time and/or the thickness H3 of the aluminum layer. As shown below in an exemplary example of the present invention, a polycrystalline silicon film is fabricated to have the largest crystallite size of about 93 µm, which is 40 more times larger than what is achievable by the traditional AIC.

Additionally, the method also includes the step of selectively etching off the aluminum layer after the structure is annealed.

Another aspect of the present invention relates to a method for fabricating a desired pattern of polycrystalline silicon usable in a semiconductor device. The method has similar processes to these disclosed above. Furthermore, after an aluminum layer is formed on the amorphous silicon film, a patterning process is performed on the aluminum layer to form a desired pattern on the aluminum layer.

The patterning process may include the steps of spin-coating a photoresist layer on the aluminum layer of the structure, forming the desired pattern in the spin-coated photoresist layer by a photolithographic process to uncover a portion of the aluminum layer according to the desired pattern, thinning the uncovered portion of the aluminum layer according to the desired pattern, and removing the remaining portion of the photoresist layer to uncover the remaining portion of the aluminum layer. The step of thinning the uncovered portion of the aluminum layer can be performed by a chemical process. Accordingly, the aluminum layer is patterned such that its thickness, H3, in the desired pattern is substantially thinner than that in the remaining portion of the aluminum layer.

Then the structure is annealed at an annealing temperature for a period of time in an $N_2$ environment with a ramp-up time to convert the amorphous silicon film into the desired pattern of polycrystalline silicon. As shown below in FIG. 13, the desired pattern of polycrystalline silicon in one embodiment corresponds to a network of lines and buses of polycrystalline silicon.

Yet another aspect of the present invention relates to a system for fabricating a polycrystalline silicon film. The system has means for forming an amorphous silicon film on a substrate, means for forming an aluminum layer on the amorphous silicon film to form a structure, and means for annealing the structure at an annealing temperature for a period of time in an $N_2$ environment with a ramp-up time to crystallize the amorphous silicon film into a polycrystalline silicon film. The system also has means for selectively etching off the aluminum layer from the annealed structure.

The means for forming the amorphous silicon film includes a PECVD system. Other forming systems can also be utilized to practice the present invention. The means for thermally forming the aluminum layer may include a thermal evaporator.

These and other aspects of the present invention are more specifically described below.

IMPLEMENTATIONS AND EXAMPLES OF THE INVENTION

Without intent to limit the scope of the invention, exemplary methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Example 1

In this exemplary example, continuous and smooth polycrystalline silicon films with very large crystallites were produced by the nano-AIC of plasma-enhanced chemical vapor deposited a-Si:H at an anneal temperature as low as 350° C. Compared to the traditional AIC, the nano-AIC method produces much smoother polycrystalline silicon films with significantly larger crystallites whose size increases with the annealing temperature ramp-up time. In the example, the average size of five of the largest grains produced by the nano-AIC method is about 89 µm, which is about 40 times larger than that what is achievable by the traditional AIC method.

In the example, silicon wafers, each with a thermally-grown silicon dioxide layer, were chosen as substrates. The thick, thermally-grown oxide layer having a thickness of about 2 µm was used to prevent the crystal orientation of a substrates from affecting the crystallization of a-Si:H. An amorphous silicon film having a thickness of about 100 nm was deposited on each substrate using plasma-enhanced chemical vapor deposition. The RF power, chamber pressure, substrate temperature, and $SiH_4$ flow rates in the PECVD system were controlled at 15 W, 0.5 Torr, 250° C., and 85 sccm, respectively. After a-Si:H deposition, the samples (structures) were removed from the PECVD system, divided into two groups, and transferred to an evaporator for thermal deposition of an aluminum layer with a thickness of about 30 nm and 200 nm on the two groups of the samples, respectively. A group of samples having the aluminum layer with the thickness of about 30 nm is utilized for the nano-AIC of a-Si:H according to embodiments of the present invention, while the group of samples having the aluminum layer with the thickness of about 200 nm is utilized for the traditional-AIC of a-Si:H. It should be noted that exposing the samples to air created a thin native silicon dioxide layer between the a-Si:H and aluminum layers. When the aluminum depositions were finished, the samples were cut into small pieces and annealed at about 350° C. for about 30 minutes in an $N_2$ environment with an annealing temperature ramp-up time as a variable. Then, the aluminum layer of the samples was removed, for example, by wet selective etching for surface morphology and crystallization characterization using an optical microscope, a scanning electron microscope (SEM), a scanning probe microscope (SPM), and a Philips X'Pert dual goniometer X-ray diffraction (XRD) system.

Figure 2:
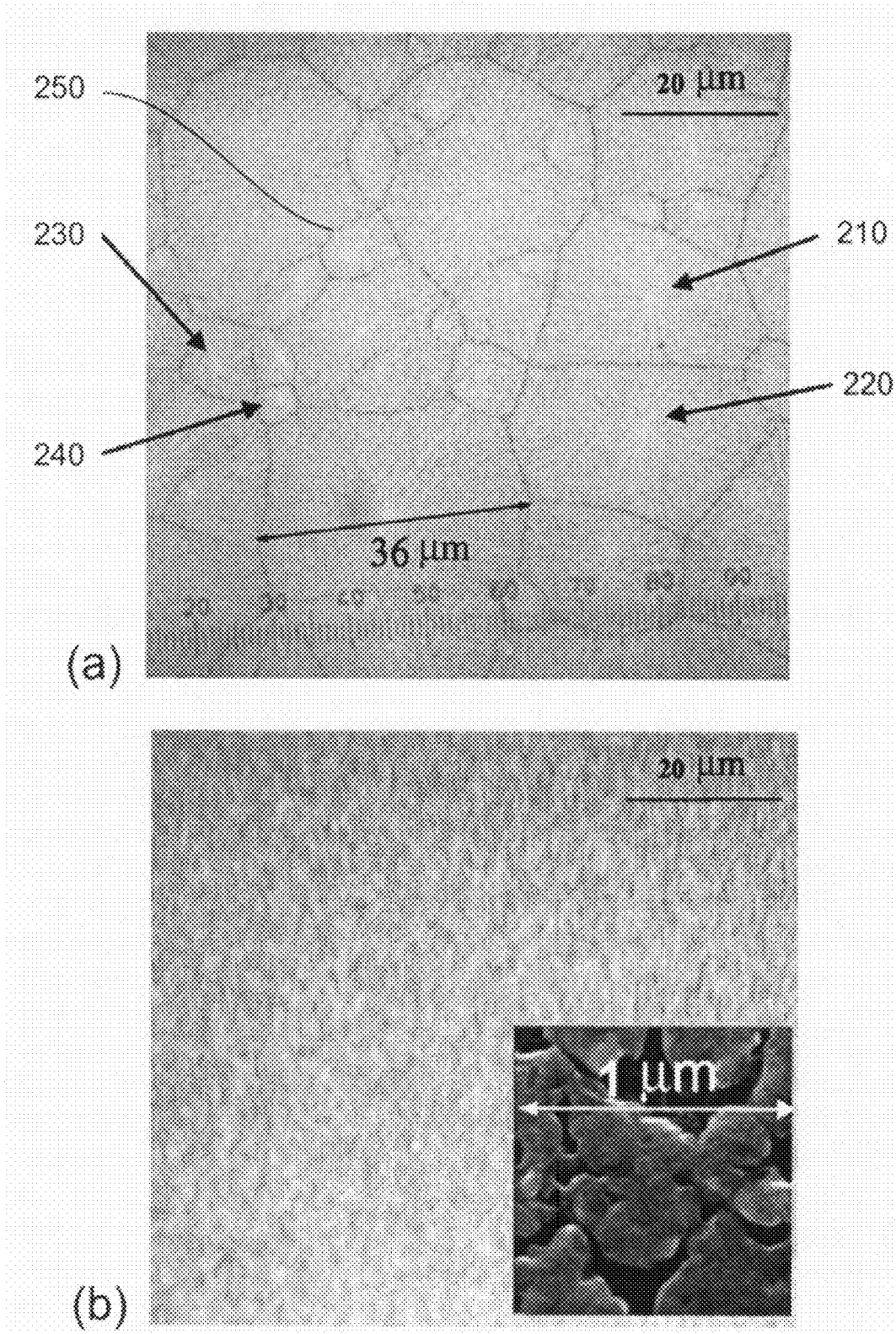
FIG. 2 shows microscopy images of a polycrystalline silicon film fabricated by (a) a nano-AIC of a-Si:H according to one embodiment of the present invention, and (b) a traditional AIC of a-Si:H, respectively, where the inset in (b) is a scanning electron microscope (SEM) image showing details of small grains of the polycrystalline silicon film fabricated by the traditional AIC of a-Si:H.

FIG. 2 shows microscopy images of a polycrystalline silicon film produced by (a) the nano-AIC process and (b) the traditional AIC process, respectively. Inset in FIG. 2(*b*) is an SEM picture showing details of the grains in the polycrystalline silicon film produced by the traditional AIC process. The SEM image is consistent with what reported by other researchers [14]. Both samples were annealed at about 350° C. in the $N_2$ environment for about 30 minutes with a ramp-up time of about 10 minutes. As shown in FIGS. 2(*a*) and 2(*b*), the largest grains are about 36 µm and 1 µm in size, respectively. Each grain was formed with a boundary 250. The bright spot in the boundary 250 of each grain of FIG. 1(*a*) is a corresponding nucleation site from which the crystalline silicon grain grows. The difference in intensity between the nucleation center and other portions of a grain may be attributable to a difference in refractive index in the two regions of the grain. FIG. 2(*a*) reveals that the grain size of the polycrystalline silicon film produced by the nano-AIC process is significantly affected by the distance between adjacent nucleation sites. When two nucleation sites are far apart, such as nucleation sites 210 and 220, grains grow larger before they contact their neighboring grains. On the other hand, when nucleation sites are close to each other, such as nucleation sites 230 and 240, two grains growing from neighboring nucleation sites quickly grow together forming a grain boundary 250, thereby limiting their size. To ensure that grain boundaries 250 observed by optical microscopy are not cracks in the silicon films, the samples were also investigated by SEM. No cracks were observed.

Figure 3:
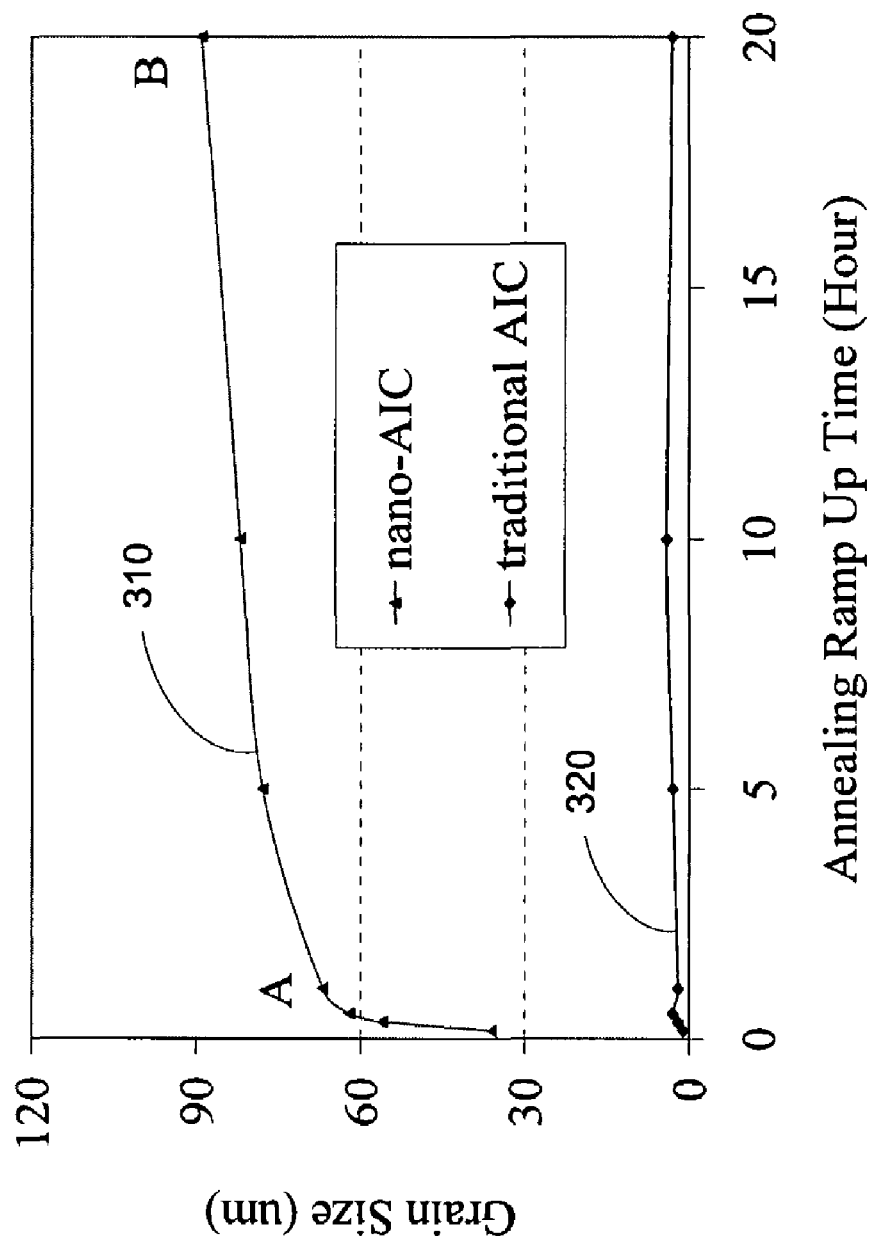
FIG. 3 shows the relationship between the grain size in a polycrystalline silicon film and the ramp up time of the annealing temperature for fabricating the polycrystalline silicon film, showing that the grain size significantly increases with the ramp up time for the nano-AIC of a-Si:H according to one embodiment of the present invention, but changes little for the traditional AIC of a-Si:H.

The above observation and analysis suggest that reducing the density of nucleation sites is a key factor for growing large grains. It is believed that not all nucleation centers are created simultaneously during an annealing process. If the annealing ramp-up time is long enough, the grains developed from the nucleation centers created earlier during the ramp-up have an opportunity to grow quite large before contacting the grains developed from the nucleation centers activated at a later time. To verify this hypothesis, the relationship between the average size of the five largest grains and the ramp-up time was carefully investigated for both the nano-AIC and traditional AIC of a-Si:H and are shown in FIG. 3. The samples studied were annealed in an $N_2$ environment at about 350° C. for about 30 minutes with the ramp-up time varied from 10 minutes to 20 hours. FIG. 3 shows that the ramp-up time has a much stronger impact on the size of the grains produced by the nano-AIC of a-Si:H than those produced by the traditional AIC of a-Si:H. In addition, FIG. 3 reveals two distinctly different relationships between the grain size and the ramp-up time for the nano-AIC of a-Si:H. The grain size increases rapidly with the ramp-up time to about 67 μm, shown by point A in FIG. 3, the largest grain ever reported, and then continuously increases with the ramp-up time at a lower rate to about 90 μm, shown by point B in FIG. 3. Although the nano-AIC grain size curve 310 versus the ramp-up time in FIG. 3 indicates that the grain size should continue to increase with the ramp-up time beyond the range investigated in this example, point A in FIG. 3 is of particular interest because the grain size increases very rapidly for the ramp-up times below the value corresponding to point A. As a comparison, a traditional-AIC grain size curve 320 versus the ramp-up time is also shown in FIG. 3, indicating the grain sizes achieved by the traditional-AIC process are much smaller than those by the nano-AIC process according to the present invention.

Figure 4:
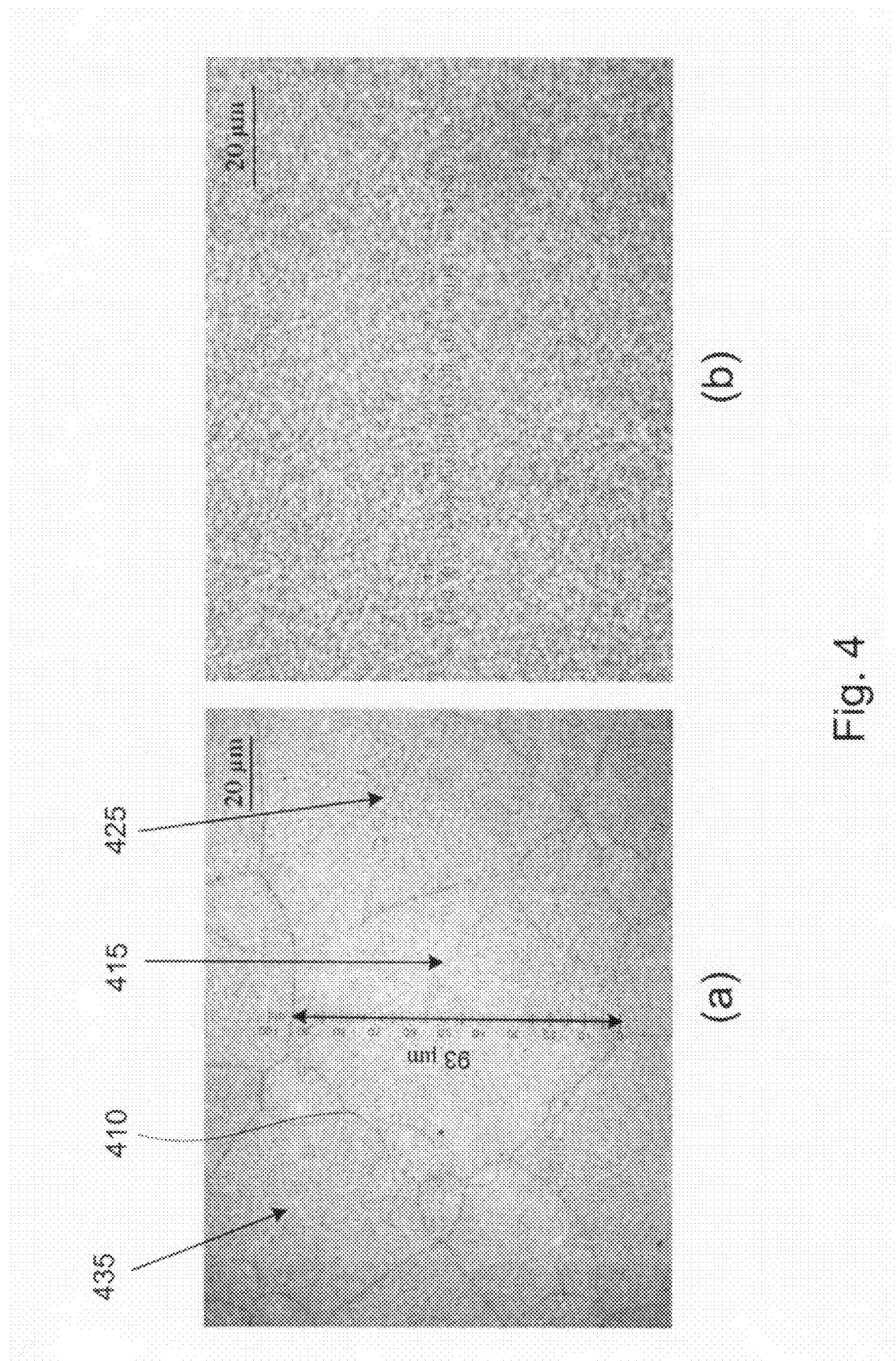
FIG. 4 shows microscopy images of a polycrystalline silicon film fabricated by (a) a nano-AIC of a-Si:H according to one embodiment of the present invention, and (b) the traditional AIC of a-Si:H, respectively, where samples are annealed for about 20 hours of the annealing ramp up time.
Figure 5:
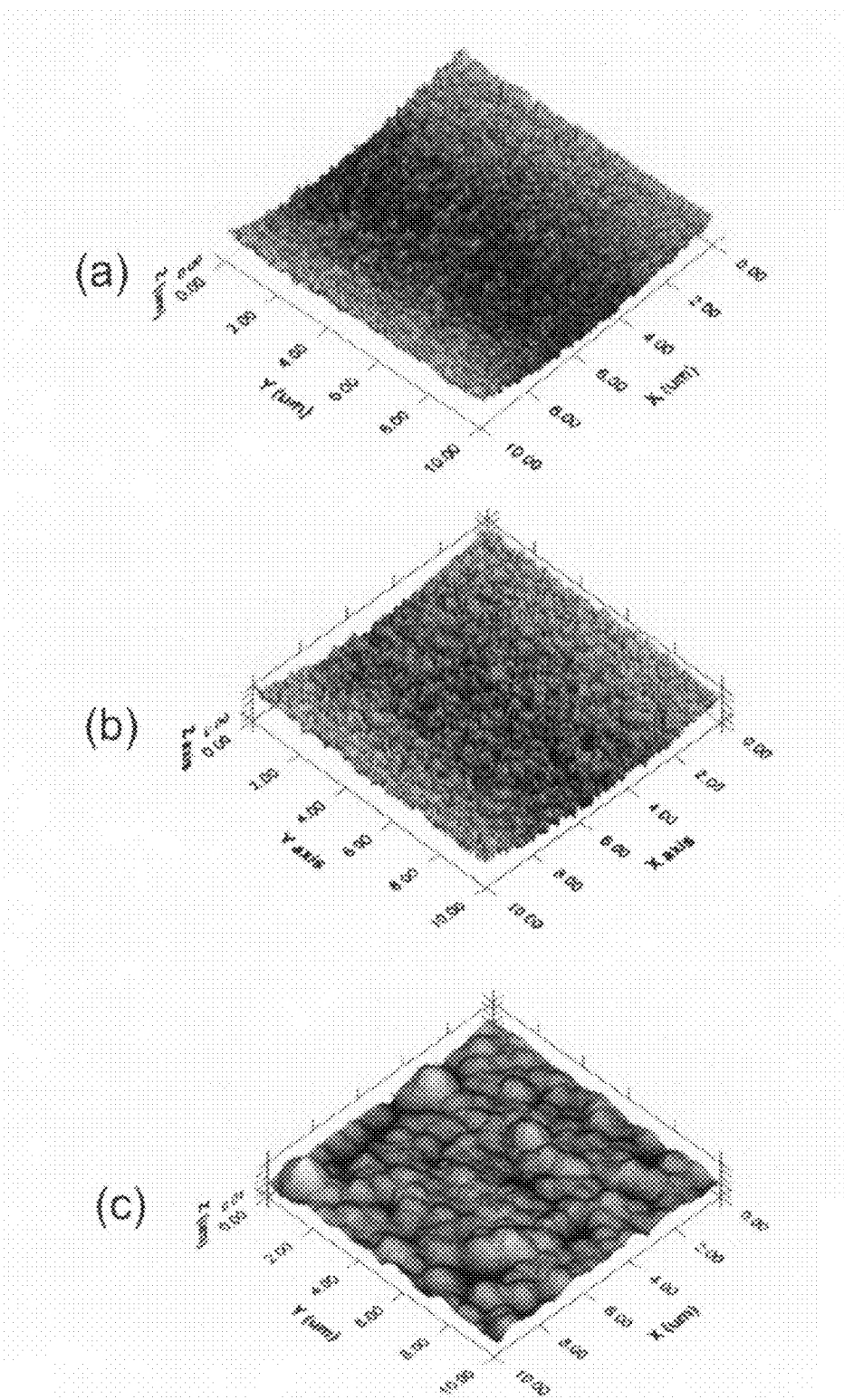
FIG. 5 shows three-dimensional scanning probe microscope (3-D SPM) images showing the surface topography of (a) a-Si:H, and a polycrystalline silicon film fabricated by (b) a nano-AIC process according to one embodiment of the present invention, and (c) the traditional AIC process.

The size of the largest grain produced in the example and the surface topography of the film containing the grain can be visualized from FIGS. 4 and 5, respectively. FIGS. 4(*a*) and (*b*) correspond to microscopy images taken from the samples of the nano-AIC of a-Si:H and the traditional AIC of a-Si:H, respectively. FIG. 4(*a*) shows that the size of the largest grain 410 is about 93 μm, which is the largest smooth grain created by the AIC technique ever reported at an annealing temperature of about 350° C. As described previously, the bright spots 415, 425, 435, . . . , within each crystallite (grain) are corresponding nucleation centers (sites).

FIG. 5 shows three of nine 10×10 μm² 3-D SPM topographic images randomly taken by a tip with a curvature of about 1 μm from (a) an a-Si:H film, and a polycrystalline silicon films produced by (b) the nano-AIC of a-Si:H and (c) the traditional AIC of a-Si:H, respectively The aluminum films of the samples in FIGS. 5(*b*) and 5(*c*) were removed by wet etching before the images were taken. It can be seen that the samples in FIGS. 5(*a*) and 5(*b*) are much smoother than the sample of FIG. 5(*c*). The average surface roughness of the samples in FIGS. 5(*a*), 5(*b*), and 5(*c*) are about 0.2 nm, 0.2 nm, and 5.6 nm, respectively. The rough surface of sample in FIG. 5(*c*) can be better visualized by the SEM image as shown in FIG. 1(*b*), where grains are not in contact with each other.

Figure 6:
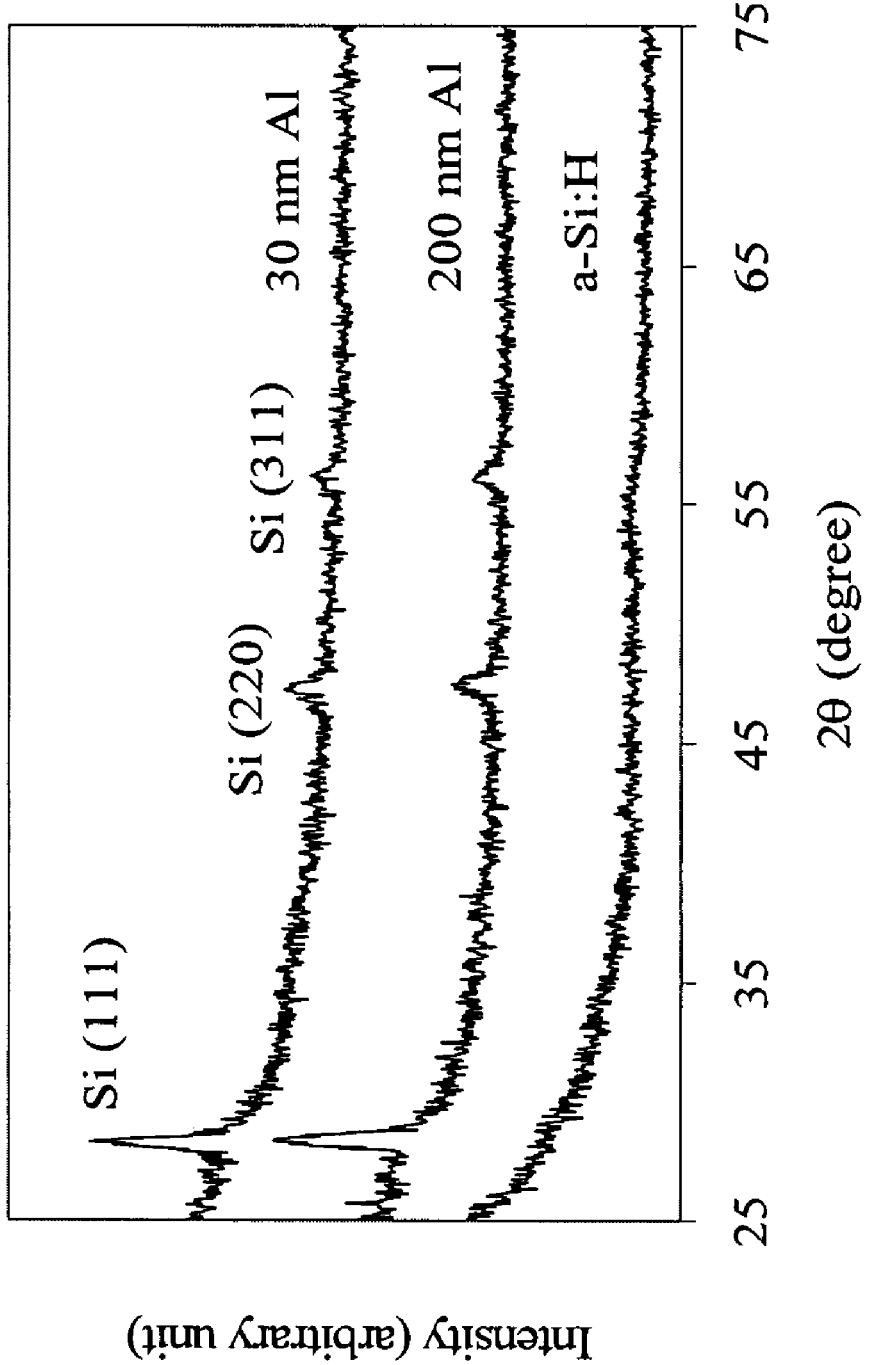
FIG. 6 shows X-ray diffraction (XRD) spectra of a-Si:H, a polycrystalline silicon film of a nano-AIC of a-Si:H according to one embodiment of the present invention, and a polycrystalline silicon film of a traditional AIC of a-Si:H, where the large peaks around 2θ=28.5 degree are Si (111), indicating the crystallization occurred for both the nano-AIC of a-Si:H and the traditional AIC of a-Si:H.

To confirm that the annealed samples are crystallized silicon, glancing incidence XRD spectra were taken and shown in FIG. 6. The large peaks around 2θ=28.5 degree in FIG. 6 correspond to Si (111), verifying that the crystallization of the a-Si:H occurred in both the nano-AIC and traditional-AIC samples. It should point out that no Si (100) related peaks were observed for either sample, even though the substrates are Si (100). This is because the very small glancing angle (0.5 degree) used for the XRD characterization prevents x-rays from reaching the Si (100) substrates.

Briefly, the successful fabrication of continuous and smooth polycrystalline silicon films with very large grains using AIC of a-Si:H is demonstrated according to the present invention. The data presented are from a controlled study on the effect of the annealing temperature ramp-up time on the size of grains produced by both the nano-AIC of a-Si:H and traditional AIC of a-Si:H. The results of the study show that, for any given ramp-up time, the grains created by the nano-AIC of a-Si:H are much larger than those produced by the traditional AIC of a-Si:H. In addition, the annealing temperature ramp-up time has a profound impact on the nano-AIC of a-Si:H, but exhibits little effect on the traditional AIC of a-Si:H. The unique grain size and ramp-up relationship for the nano-AIC provides a direction for further increasing the grain size using the nano-AIC of a-Si:H. This example also shows that the nano-AIC results in continuous and smooth polycrystalline silicon films with very large grains (about 93 μm) at an annealing temperature of about 350° C.

Example 2

In this example, the grain size and surface topography of a polycrystalline silicon film fabricated by the nano-AIC of a-Si:H according to one embodiment of the present invention are further characterized. Compared to the traditional AIC, the nano-AIC method produces smooth polycrystalline silicon films of very large grain size at significantly reduced temperatures. The average size of the five largest grains found in a sample produced by the nano-AIC process at an annealing temperature of about 280° C. is about 53 μm, which is about 30 times larger than that produced by the traditional AIC process.

Figure 7:
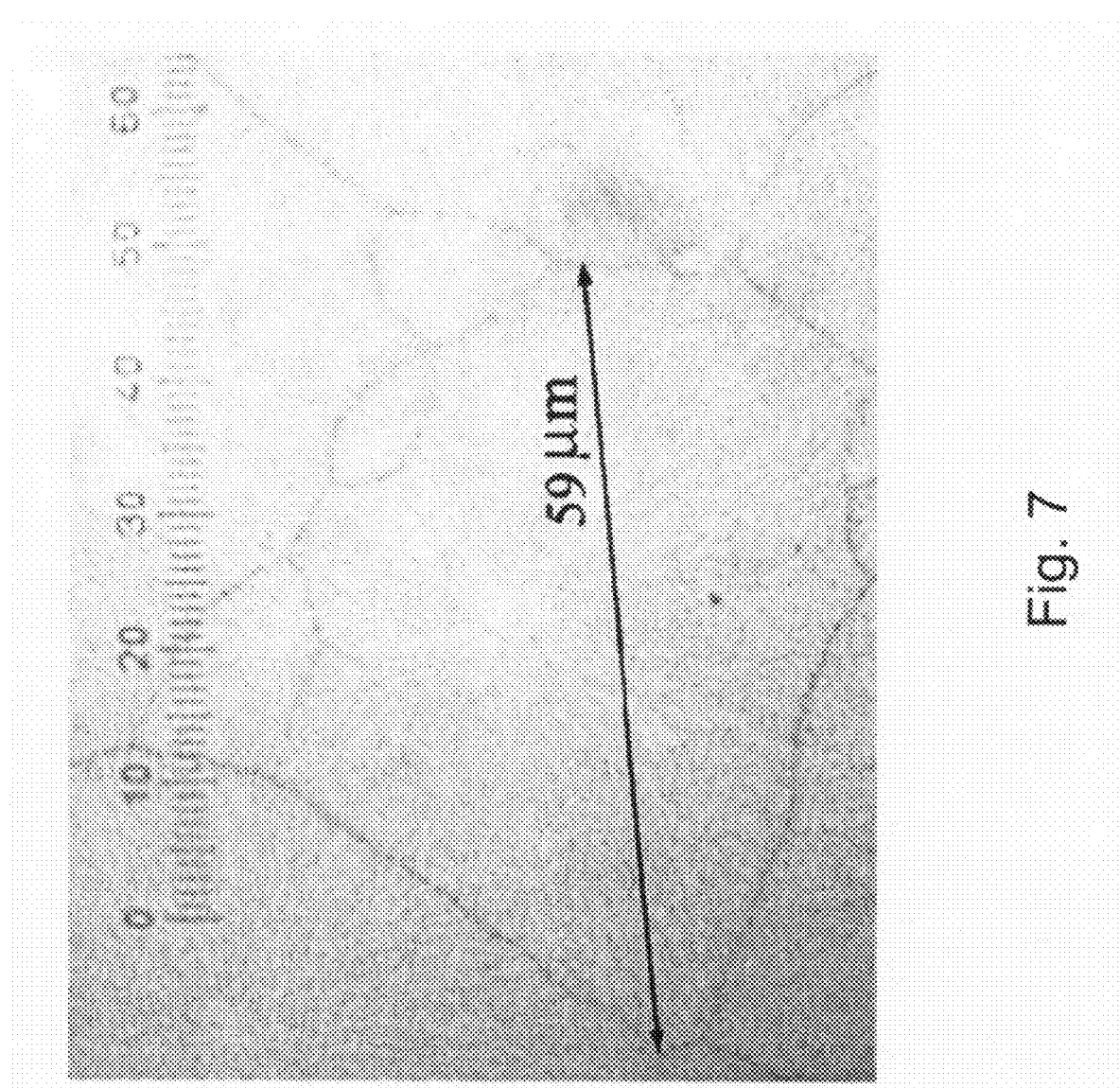
FIG. 7 shows a microscopy image of a polycrystalline silicon film according to one embodiment of the present invention, where the large grains is formed at a temperature about 280° C. by the nano-AIC process.
Figure 8:
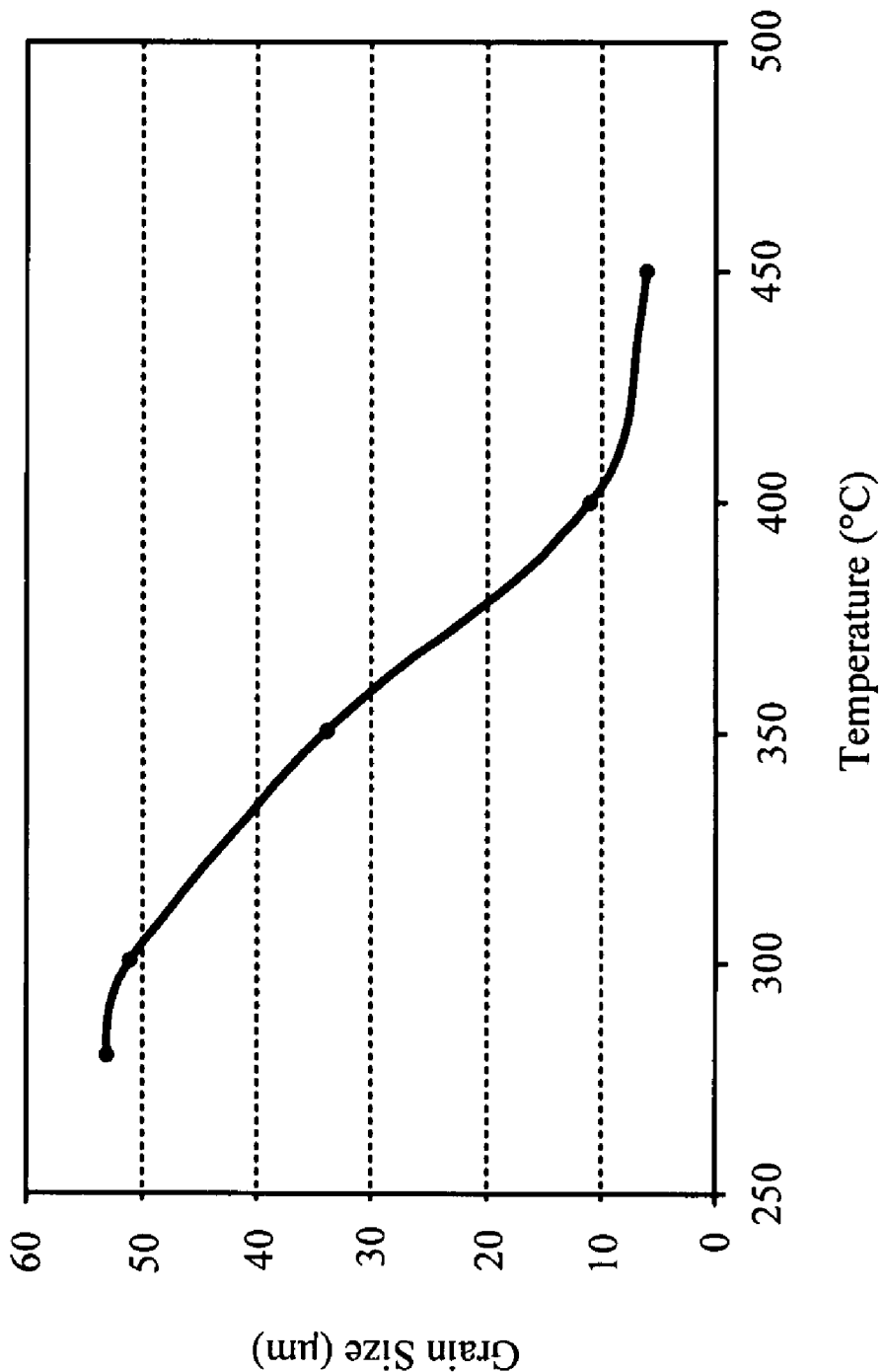
FIG. 8 shows the relationship between the annealing temperature and grain sizes of a polycrystalline silicon film fabricated by a nano-AIC process according to one embodiment of the present invention, where the average of five largest grain sizes increases with the decrease of the annealing temperature, and the lowest temperature for the crystallization is about 280° C.

Nano-AIC not only increases the grain size and improves the surface topography, but also significantly reduces the crystallization temperature of a-Si:H. FIG. 7 shows a microscopy image of a polycrystalline silicon film produced by the nano-AIC at about 280° C. For the traditional AIC, no crystallization was observed for annealing temperatures below 340° C. Comparing FIG. 7 with FIG. 2(*a*), it is clear that the largest grain produced by the nano-AIC at an annealing temperature of about 280° C. is larger than that created at an annealing temperature of about 350° C., which indicates that lower temperature annealing may produce larger grains of polycrystalline silicon. To better understand the effect of annealing temperature on grain size, the relationship between the average grain size of the five largest grains and the annealing temperature for the nano-AIC of a-Si:H were investigated. All samples investigated were annealed in an $N_2$ environment for about 30 minutes. The largest grains in the each sample were identified by manually scanning the sample under a microscope and recording the size of the largest crystallites. FIG. 8 reveals that the grain size increases as the anneal temperature is reduced from about 450° C. to about 280° C. The lower temperature annealing creates fewer nucleation centers than what the high temperature annealing does. Statistically, fewer nucleation centers result, on the average, in larger distances between the centers, which provides larger growing spaces for the grains, and therefore, larger grains.

In summary, the above results show that the low crystallization temperature and the grain size and the surface topography of polycrystalline silicon fabricated by the nano-AIC of a-Si:H are substantially different from that produced by the traditional AIC of a-Si:H. The average of the five largest grains produced in this example at annealing temperatures as low as 280° C. is about 30 times larger than that produced by the traditional AIC method. The minimum temperature required for the nano-AIC of a-Si:H is about 60° C. lower than that of the traditional AIC approach.

Example 3

In this example, effects of stress in a-Si:H and nano-thickness aluminum films on the crystallization of a-Si:H are demonstrated. It was found that the tensile stress in a-Si:H considerably affects the AIC of a-Si:H, and that the AIC of a-Si:H induced by an aluminum layer of about 15 nm in thickness is significantly stronger than that induced by an aluminum layer of about 200 nm in thickness. Accordingly, a novel technique for selectively crystallizing a-Si:H is demonstrated, which may find widely applications in the semiconductor device fabrication.

In this example, two single crystalline silicon wafers (100), A and B, with thermally-grown silicon oxide layers were selected as substrates for an investigation of the effect of stress on the AIC of a-Si:H. Thick, thermally-grown oxide layers were used to prevent the crystal orientation of the substrates from affecting the a-Si:H crystallization. Amorphous silicon films of about 100 nm thickness were deposited on the top surface of the substrates using plasma-enhanced chemical vapor deposition in bothe samples A and B. The RF power, chamber pressure, substrate temperature, and $SiH_4$ (2% diluted in He) flow rates were controlled at 15 W, 0.5 Torr, 250° C., and 85 sccm, respectively. The samples were then transferred to an evaporator for thermal deposition of about 200 nm of aluminum on the top surface of the a-Si:H layer. Then, a 100 nm thick a-Si:H film was deposited on the bottom surface of sample B using the same PECVD conditions used for the top surface depositions of a-Si:H. To ensure that both samples A and B were thermal treated equally, sample A was placed facedown in the PECVD system and underwent the same thermal cycle as sample B. When the thin film of aluminum depositions were finished, both samples A and B were annealed in an $N_2$ environment, and the remaining aluminum was removed by wet selective etching for surface morphology and crystallization characterization using an optical microscope and a Philips X'Pert dual goniometer x-ray diffraction (XRD) system.

Figure 9:
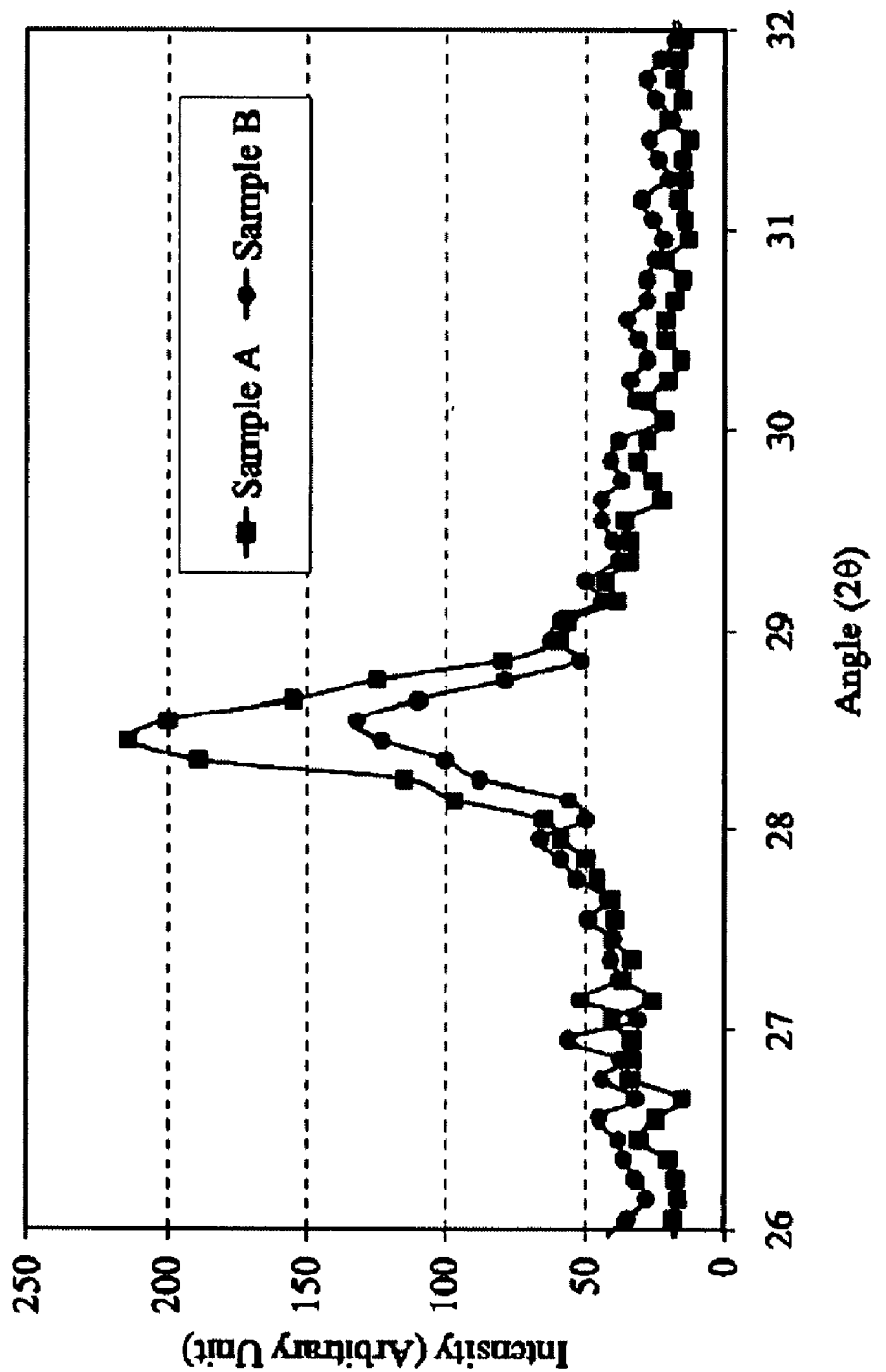
FIG. 9 shows XRD spectra of samples A and B produced according to embodiments of the present invention, where sample A has no bottom surface coating, while sample B is coated with about 100 nm a-Si:H on the bottom surface of the substrate.

FIG. 9 shows XRD spectra of the samples A and B annealed at a temperature of about 275° C. The peaks around $2\theta=28.5$ correspond to Si (111), indicating that the crystallization occurred. It can be seen that the peak intensity of sample B is much lower than that of sample A. Since the thin film structures on the top surface and heat treatment of both samples A and B are identical, and the only difference between sample A and B is the bottom surface structures, the observed differences in the XRD spectra result from the bottom surface coating in sample B.

Generally, thin film coatings introduce stress. To study the stresses induced by the top surface films, a Tencor Flex2300 profilometer was used to measure the curvature of the wafers, and Stoney's equation was employed to calculate the stresses from the curvature. The study showed that the depositions of a-Si:H on the top surfaces resulted in a tensile stress of about 450 MPa. The tensile stress caused both samples A and B to bend concavely. After deposition of an a-Si:H film onto the bottom surface of sample B, the tensile stress on the bottom surface forced the substrate to bend downward. As an end result, sample B became flatter, which stretches the a-Si:H film on the top surface even further and, therefore, increases the tensile stress on the top a-Si:H film. Hence, it is concluded that the larger tensile stress in sample B retarded the AIC of the a-Si:H.

The stress discussed above was obtained at room temperature. At the annealing temperature, the thermal expansion of the different materials introduces additional stress. The thermal expansion coefficient of aluminum is about $23 \times 10^{-6}/°$ C., which is about ten time larger than that of a-Si:H ($2.5 \times 10^{-6}/°$ C.) [15]. Calculations show that the expansion of Al at a temperature of about 275° C. introduces about 300 MPa of additional tensile stress into the a-Si:H underneath it. This indicates that if the thickness of the aluminum is formed very thin to minimize the effect of thermal expansion of aluminum on a-Si:H, while maintaining sufficient aluminum to induce crystallization of a-Si:H, the AIC of a-Si:H becomes stronger.

Figure 10:
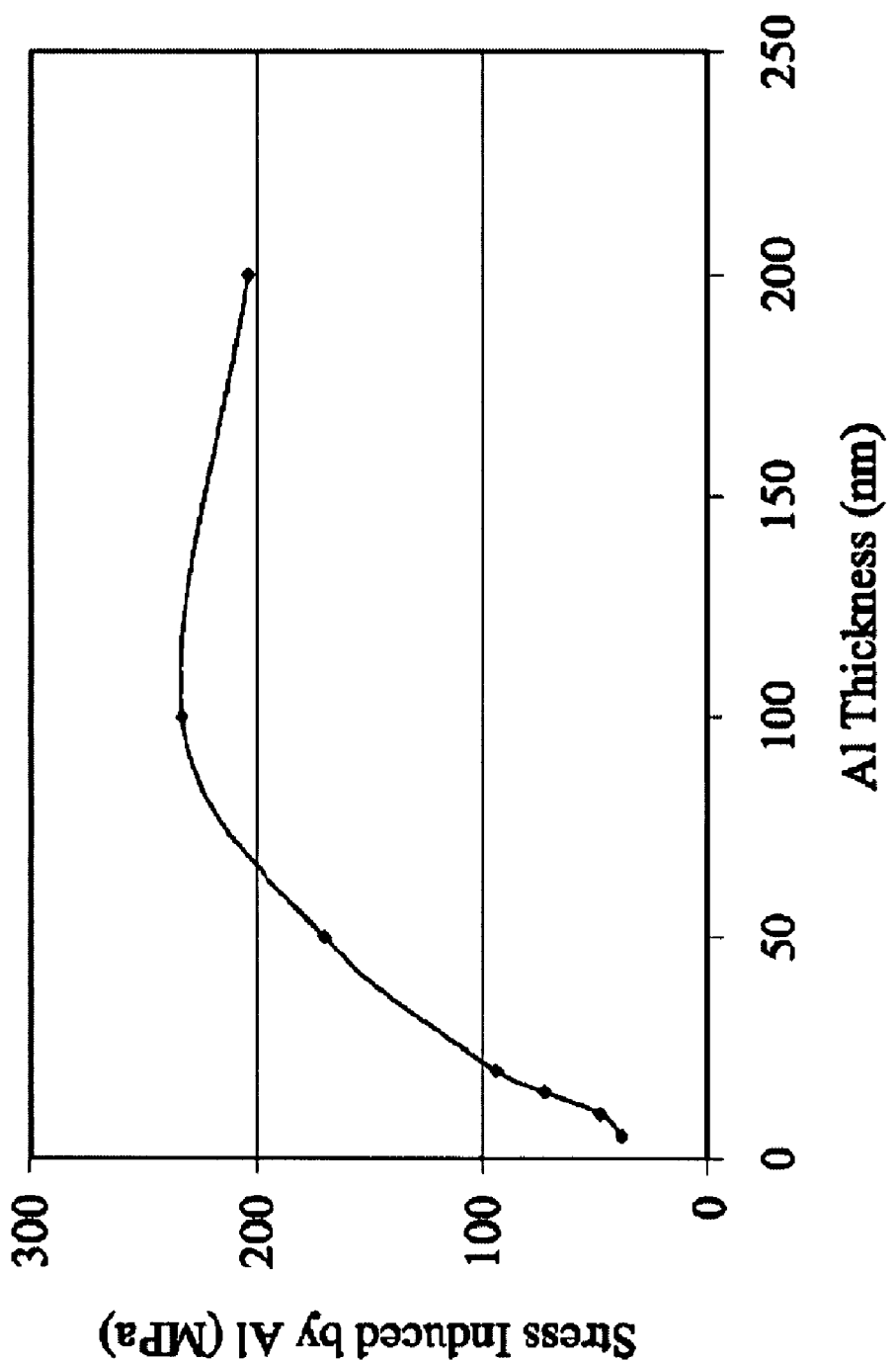
FIG. 10 shows the relationship between the stress induced by the thickness of an aluminum film according to one embodiment of the present invention.
Figure 11:
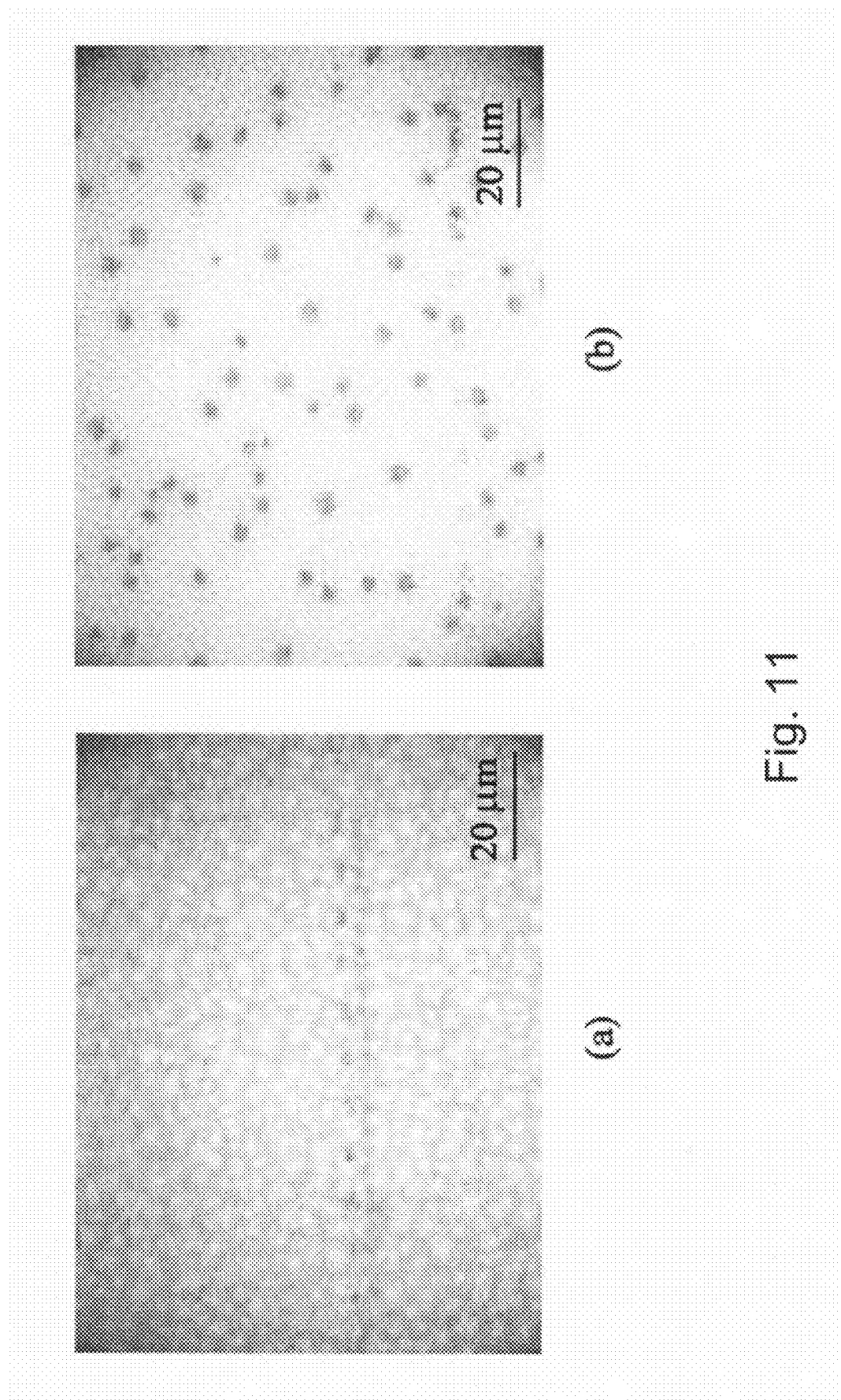
FIG. 11 shows optical images of polycrystalline silicon samples annealed at 250° C. for 30 min according to embodiments of the present invention, where (a) the sample is formed with an aluminum film of about 15 nm, and (b) the sample is formed with aluminum about 200 nm.
Figure 12:
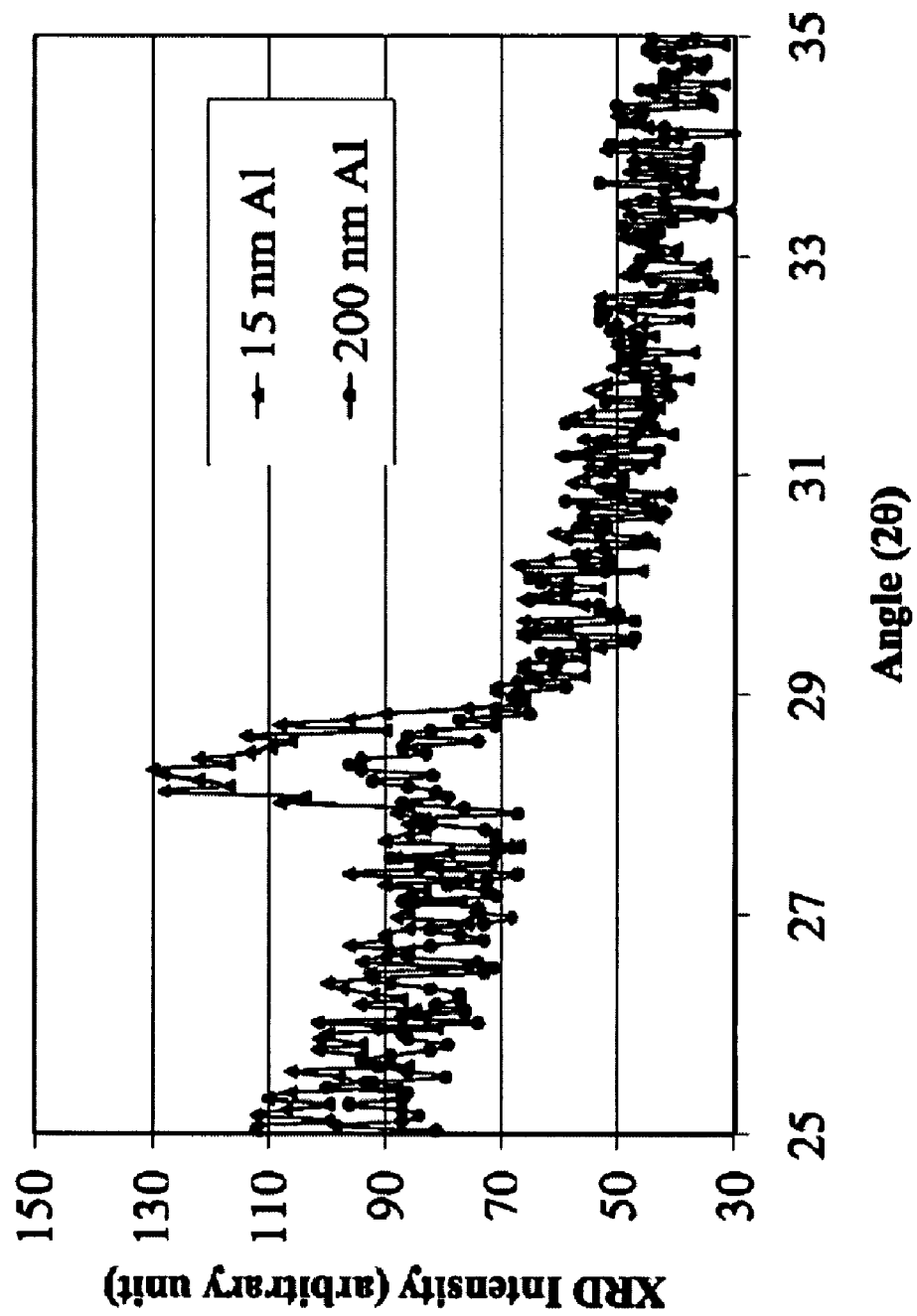
FIG. 12 shows XRD spectra of the samples with the aluminum thickness of 15 nm and 200 nm according to embodiments of the present invention, where both samples are annealed at about 250° C. for 30 min.

To verify the hypothesis, two experiments were conducted. The first one investigated the relationship between the stress induced by the aluminum layer and the thickness of the aluminum layer. The second one focused on the impact of the aluminum thickness on the AIC of a-Si:H. The results are shown in FIGS. 10-12. FIG. 10 shows that the aluminum-induced stress changes very little for the aluminum thicknesses between about 100 nm to about 200 nm, and but decreases rapidly for the aluminum thicknesses less than about 100 nm. FIG. 11 shows microscopy images of two samples after being annealed at about 250° C. for about 30 minutes and removal of remaining aluminum. The image shown in FIG. 11(a), taken from the sample with about 15 nm thick aluminum, shows that the whole sample surface is covered by micro-grains, while the image shown in FIG. 11(b) for the sample with a 200 nm thick aluminum film shows isolated grains sparsely distributed over the surface. FIG. 12 shows XRD spectra of the two samples. The larger intensity around $2\theta=28.5$ indicates that the sample coated with a 15 nm thick aluminum film has a higher degree of crystallization than the sample coated with a 200 nm thick aluminum film. The former is corresponding to a nano-AIC of a-Si:H, while the latter is corresponding to a traditional-AIC of a-Si:H.

Figure 13:
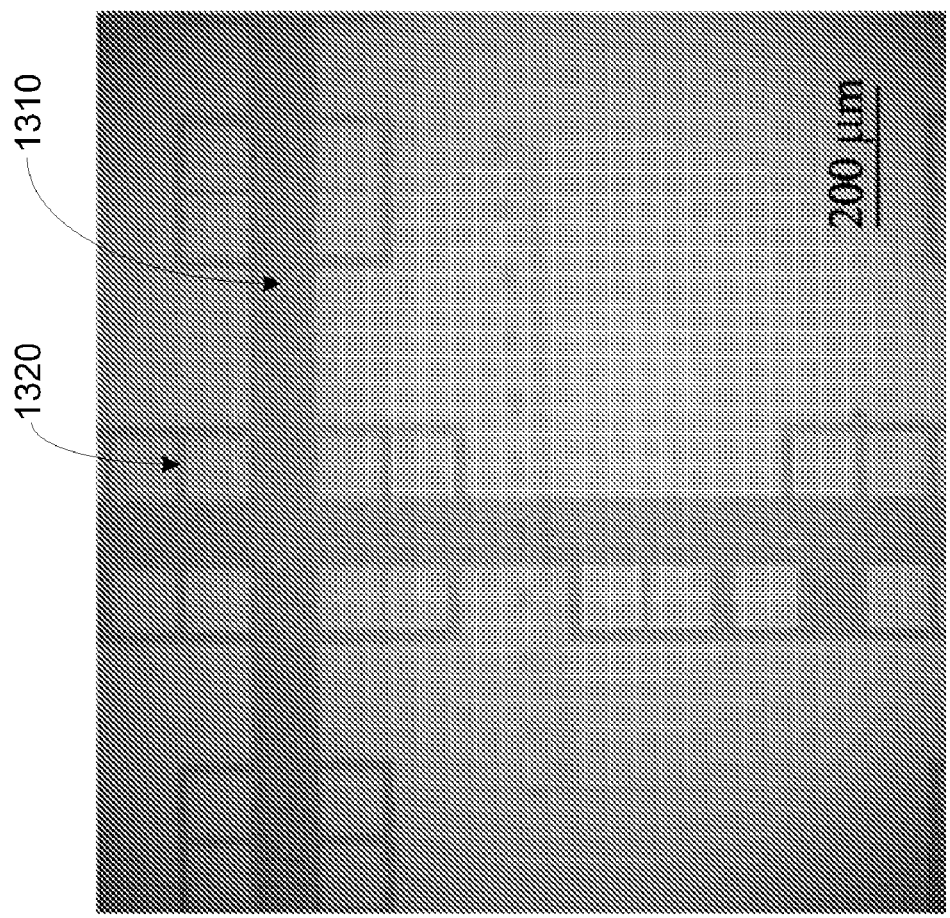
FIG. 13 shows a microscopy image of a sample after annealing and removal of aluminum according to one embodiment of the present invention, where the crystallized lines and buses are covered by thinner aluminum before annealing, and no grains are observed in the area outside the lines and buses.

According to the present invention, a new method for selective crystallization of amorphous silicon is disclosed by utilizing the significant strong crystallization induced by a nanometer thick aluminum film. Traditionally, aluminum is deposited on locations where crystallization is needed. After annealing, the amorphous silicon under the aluminum film becomes crystallized. According to the present invention, the thickness difference in the aluminum films can be used to selectively crystallize a-Si:H. For example, a 100 nm thick a-Si:H was deposited onto a silicon substrate with a thermally grown oxide of about 2 μm. Then, a thermal evaporator was used to deposit about 200 nm thick aluminum film on the top surface of the amorphous silicon film. A photoresist layer was spin coated on the aluminum film of the sample, and photolithography was used to form a desired pattern in the photoresist layer. Then, a chemical mixture was used to thin the aluminum film to a thickness of approximately 20 nm through the photoresist windows. Finally, the photoresist layer was removed and the sample was annealed at about 275° C. for about 10 minutes in a nitrogen environment. Accordingly, the aluminum layer is patterned such that its thickness (about 20 nm) in the desired pattern is substantially thinner than that (about 200 nm) in the remaining portion of the aluminum layer. Therefore, the crystallization of a-Si:H under the desired pattern is corresponding to the nano-AIC of a-Si:H at the annealing temperature of about 275° C. At the annealing temperature, no crystallization of a-Si:H occurs in the area under the remaining portion (200 nm in thickness) of the aluminum layer. FIG. 13 shows a microscopy image of the sample surface following removal of the remaining aluminum. The image shows that the lines 1310 and buses 1320 in a desired pattern on the sample are fully filed with grains, while no grains were observed in other areas.

Among other things, compared to a traditional AIC process, the nano-AIC process of the present invention produces much smoother polycrystalline silicon film with very large crystallites at low temperatures. Furthermore, unlike traditional AIC, the grain sizes produced by the nano-AIC of the present invention increase considerably with annealing temperature ramp-up time. The present invention also provides a method of selectively crystallizing an amorphous silicon film according to the thickness of an aluminum layer formed on the amorphous silicon film.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1] Oliver Nast, Andreas J. Hartmann, Journal of Applied Physics, 88 716 (2000).

[2] H. A. Naseem, W. D. Brown, Ram Kishore, Chris Hotz, Electrochemical and Solid-State Letters, 4, G14 (2001).

[3] Y. Liu, M. D. Deal, M. Sultana, J. D. Plummer, Materials Research Society Symposium—Proceedings, 762, 669 (2003).

[4] Oliver Nast, Andreas J. Hartmann, Journal of Applied Physics, 88, 716 (2000).

[5] S. Gall, M. Muske, I. Sieber, O. Nast, W. Fuhs, Journal of Non-Crystalline Solids, 299, 741 (2002).

[6] T. J. Konno, R. Sinclair, Philosophical Magazine B (Physics of Condensed Matter, Electronic, Optical and Magnetic Properties), 66, 749 (1992)

[7] L. Cai, H. Abu-Safe, M. Zou, M. Barghouti, M. Hossain, H. Naseem, W. B. Brown, Proceedings of the Symposium on Solid State Physics, The Electrochemical Society, PV 2004-12, 307 (2004).

[8] C. M. Hsu, I. F. Chen, M. C. Yu, Japanese Journal of Applied Physics, Part 1: Regular Papers and Short Notes and Review Papers, 42, No. 8, 4928 (2003).

[9] Shu Hamada, Koichi Kawahara, Sadahiro Tsurekawa, Tadao Watanabe, Takashi Sekiguchi, Materials Research Society Symposium—Proceedings, 586, 163 (2000).

[10] Victor W. C. Chan, Philip C. H. Chan, Chunshan Yin, IEEE Transactions on Electron Devices, 49, 1384 (2002).

[11] J. Klein, J. Schneider, M. Muske, S. Gall, W. Fuhs, Thin Solid Films, 451-452, 481 (2004).

[12] Oliver Nast, Stephan Brehme, Stephen Pritchard, Armin G. Aberle, Stuart R. Wenham, Solar Energy Materials and Solar Cells, 65, 385 (2001)

[13] Jae Hwan Oh, Jong Hyun Choi, Kyung Ho Kim, Jun Hyuk Cheon, Jin Jang, Electrochemical and Solid-State Letters, 7, H52-H54 (2004).

[14] E Pihan, A Slaoui, P Roca i Cabarrocas, A Focsa, Source: Thin Solid Films, 451-452, 328-333 (2004).

[15] T. Searle, T. A. Hayes, and M. E. Kassner, Properties of Amorphous Silicon and Its Alloys, 370, INSPEC (1997).

What is claimed is:

1. A method for forming a polycrystalline silicon film, comprising the steps of:
   a) providing a substrate having a thermally-grown silicon dioxide layer adapted for preventing the crystal orientation of the substrate from affecting the crystallization of the amorphous silicon film, wherein the thermally-grown silicon dioxide layer has a thickness in a range of about 1-3 µm;
   b) forming an amorphous silicon film on the thermally-grown silicon dioxide layer of the substrate;
   c) forming an aluminum layer having a thickness in a range of about 5-100 nm on the amorphous silicon film to form a structure having the substrate, the amorphous silicon film and the aluminum layer; and
   d) annealing the structure at an annealing temperature effective for a period of time in a nitrogen environment with an annealing temperature ramp-up time of at least about 10 minutes to crystallize the amorphous silicon film to form a polycrystalline silicon film comprising a plurality of crystallites, wherein the average crystallite size of the plurality of crystallites increases with the annealing temperature ramp-up time.

2. The method of claim 1, further comprising the step of selectively etching off the aluminum layer from the annealed structure.

3. The method of claim 1, wherein the substrate comprises a silicon wafer.

4. The method of claim 1, wherein the amorphous silicon film has a thickness in a range of about 50-200 nm.

5. The method of claim 1, wherein the step of forming the amorphous silicon film is performed with a plasma-enhanced chemical vapor deposition (PECVD) process, and wherein the PECVD system is configured such that the RF power, chamber pressure, substrate temperature, and silane flow rates are about 15 W, 0.5 Torr, 250° C., and 85 sccm, respectively.

6. The method of claim 1, wherein the step of forming the aluminum layer is performed by a metal evaporation process.

7. The method of claim 1, wherein the aluminum layer is formed uniformly such that the thickness of the aluminum layer is substantially constant or is formed variable over the aluminum layer with a desired pattern.

8. The method of claim 1, wherein the annealing temperature is in a range of about 50-450° C.

9. A method for forming a desired pattern of polycrystalline silicon usable in a semiconductor device, comprising the steps of:
   a) forming an amorphous silicon film on a thermally-grown silicon dioxide layer of a substrate, wherein the thermally-grown silicon dioxide layer is adapted for preventing the crystal orientation of the substrate from affecting the crystallization of the amorphous silicon film and has a thickness in a range of about 1-3 µm;

b) forming an aluminum layer having a thickness in a range of about 5-100 nm on the amorphous silicon film to form a structure having the substrate, the amorphous silicon film and the aluminum layer;

c) patterning the aluminum layer of the structure to form a desired pattern thereon; and d) annealing the patterned structure at an annealing temperature for a period of time in nitrogen environment with an annealing temperature ramp-up time of at least about 10 minutes to crystallize the amorphous silicon film to form a polycrystalline silicon film with the desired pattern, wherein the polycrystalline film comprises a plurality of crystallites, and wherein the average crystallite size of the plurality of crystallites increases with the annealing temperature ramp-up time.

10. The method of claim 9, further comprising the step of selectively etching off the aluminum layer from the annealed structure.

11. The method of claim 9, wherein the substrate comprises a silicon wafer having a thermally-grown silicon dioxide layer on which the amorphous silicon film is formed.

12. The method of claim 9, wherein the amorphous silicon film has a thickness in a range of about 50-200 nm.

13. The method of claim 9, wherein the step of forming the amorphous silicon film is performed with a plasma-enhanced chemical vapor deposition (PECVD) process.

14. The method of claim 9, wherein the step of forming the aluminum layer is performed with a metal evaporation process.

15. The method of claim 9, wherein the step of patterning the aluminum layer comprises the steps of spin-coating a photoresist layer on the aluminum layer of the structure, forming a desired pattern in the spin-coated photoresist layer by a photolithographic process to uncover a portion of the aluminum layer according to the desired pattern, thinning the uncovered portion of the aluminum layer according to the desired pattern, and removing the remaining portion of the photoresist layer to uncover the remaining portion of the aluminum layer.

16. The method of claim 15, wherein the step of thinning the uncovered portion of the aluminum layer is performed by a chemical process.

17. The method of claim 15, wherein the aluminum layer is patterned such that its thickness in the desired pattern is substantially thinner than that in the remaining portion of the aluminum layer, and wherein the thickness of the aluminum layer in the desired pattern is in a range of about 5-100 nm.

18. The method of claim 9, wherein the annealing temperature is in a range of about 50-450° C.

19. The method of claim 1, wherein the annealing temperature ramp-up time is in a range of about 30 minutes to 20 hours.

20. The method of claim 1, wherein the annealing temperature is in a range of about 275-350° C.

21. The method of claim 9, wherein the annealing temperature ramp-up time is in a range of about 30 minutes to 20 hours.

22. The method of claim 9, wherein the annealing temperature is in a range of about 275-350° C.

23. A method for forming a polycrystalline silicon film, comprising the steps of:

a) providing a substrate having a thermally-grown silicon dioxide layer;

b) forming an amorphous silicon film on the thermally-grown silicon dioxide layer of the substrate;

c) forming an aluminum layer having a thickness in a range of about 5-100 nm on the amorphous silicon film to form a structure having the substrate, the amorphous silicon film and the aluminum layer; and d) annealing the structure at an annealing temperature in a range of about 275-350° C. effective for a period of time in a nitrogen environment with an annealing temperature ramp-up time in a range of about 30 minutes to 20 hours to crystallize the amorphous silicon film to form a polycrystalline silicon film comprising a plurality of crystallites, wherein the average crystallite size of the plurality of crystallites increases with the annealing temperature ramp-up time.

24. A method for forming a desired pattern of polycrystalline silicon usable in a semiconductor device, comprising the steps of:

a) forming an amorphous silicon film on a substrate;

b) forming an aluminum layer having a thickness in a range of about 5-100 nm on the amorphous silicon film to form a structure having the substrate, the amorphous silicon film and the aluminum layer;

c) patterning the aluminum layer of the structure to form a desired pattern thereon; and d) annealing the patterned structure at an annealing temperature in a range of about 275-350° C. for a period of time in nitrogen environment with an annealing temperature ramp-up time in a range of about 30 minutes to 20 hours to crystallize the amorphous silicon film to form a polycrystalline silicon film with the desired pattern, wherein the polycrystalline film comprises a plurality of crystallites, wherein the average crystallite size of the plurality of crystallites increases with the annealing temperature ramp-up time.

25. A method for forming a polycrystalline silicon film, comprising the steps of:

a) providing a substrate having a thermally-grown silicon dioxide layer adapted for preventing the crystal orientation of the substrate from affecting the crystallization of the amorphous silicon film;

b) forming an amorphous silicon film on the then thermally-grown silicon dioxide layer of the substrate;

c) forming an aluminum layer having a thickness in a range of about 5-100 nm on the amorphous silicon film to form a structure having the substrate, the amorphous silicon film and the aluminum layer; and d) annealing the structure at an annealing temperature effective for a period of time in a nitrogen environment with an annealing temperature ramp-up time of at least about 10 minutes to crystallize the amorphous silicon film to form a polycrystalline silicon film-comprising a plurality of crystallites, wherein the average crystallite size of the plurality of crystallites increases with the annealing temperature ramp-up time.

26. A method for forming a desired pattern of polycrystalline silicon usable in a semiconductor device, comprising the steps of:

a) forming an amorphous silicon film on a thermally-grown silicon dioxide layer of a substrate, wherein the thermally-grown silicon dioxide layer is adapted for preventing the crystal orientation of the substrate from affecting the crystallization of the amorphous silicon film;

b) forming an aluminum layer having a thickness in a range of about 5-100 nm on the amorphous silicon film to form a structure having the substrate, the amorphous silicon film and the aluminum layer;

c) patterning the aluminum layer of the structure to form a desired pattern thereon; and d) annealing the patterned structure at an annealing temperature for a period of time in nitrogen environment with an annealing temperature ramp-up time of at least about 10 minutes to crystallize the amorphous silicon film to form a polycrystalline silicon film with the desired pattern, wherein the polycrystalline film comprises a plurality of crystallites, wherein the average crystallite size of the plurality of crystallites increases with the annealing temperature ramp-up time.

* * * * *